United States Patent
Chen

(10) Patent No.: US 8,536,907 B2
(45) Date of Patent: Sep. 17, 2013

(54) POWER ON RESET SIGNAL GENERATING APPARATUS AND METHOD

(75) Inventor: Yi-Lung Chen, Keelung (TW)

(73) Assignee: ISSC Technologies Corp., Hsinchu (TW)

( * ) Notice: Subject to any disclaimer, the term of this patent is extended or adjusted under 35 U.S.C. 154(b) by 25 days.

(21) Appl. No.: 13/244,279

(22) Filed: Sep. 24, 2011

(65) Prior Publication Data

US 2013/0076410 A1 Mar. 28, 2013

(51) Int. Cl.
*H03L 7/00* (2006.01)
(52) U.S. Cl.
USPC ............................ 327/143; 327/142; 327/198
(58) Field of Classification Search
USPC .......................................... 327/142, 143, 198
See application file for complete search history.

(56) References Cited

U.S. PATENT DOCUMENTS

| 4,698,531 | A | * | 10/1987 | Jones | 327/143 |
|---|---|---|---|---|---|
| 5,917,225 | A | | 6/1999 | Yamazaki et al. | |
| 5,959,477 | A | | 9/1999 | Chung | |
| 6,052,006 | A | * | 4/2000 | Talaga et al. | 327/143 |
| 6,181,173 | B1 | | 1/2001 | Homol et al. | |
| 6,492,848 | B1 | | 12/2002 | Lee | |
| 6,972,602 | B2 | | 12/2005 | Akamatsu et al. | |
| 7,271,624 | B2 | | 9/2007 | Zolfaghari | |

* cited by examiner

*Primary Examiner* — John Poos
(74) *Attorney, Agent, or Firm* — Jianq Chyun IP Office

(57) ABSTRACT

A power on reset signal generating apparatus is provided. The power on reset signal generating apparatus includes a trigger capacitor, a reference current supplying circuit, and a current regulator. One end of the trigger capacitor is coupled to a ground voltage, and the other end of the trigger capacitor generates a power on reset signal. The reference current supplying circuit is coupled to a signal generating end. The current regulator is coupled to the signal generating end, and the signal generating end draws a splitting current to adjust the value of the current received by the trigger capacitor.

9 Claims, 3 Drawing Sheets

US 8,536,907 B2

POWER ON RESET SIGNAL GENERATING APPARATUS AND METHOD

BACKGROUND OF THE INVENTION

1. Field of the Invention

The invention generally relates to a signal generating apparatus, in particular, to a power on reset signal generating apparatus.

2. Description of Related Art

A power on reset signal generating apparatus is widely used in nowadays integrated circuits. The power on reset signal generating apparatus is built-in a system, and generates a power on reset signal after a supply voltage provided to the system rising stable. The power on reset signal is used to reset the digital circuits in the system to prevent the digital circuits to enter an unknown state.

In the prior art, the power on reset signal generating apparatus always need a large size capacitor for generating the power on reset signal with an effective width. That is, the circuit area of the power on reset signal generating apparatus is large, and the cost of the system is increased.

SUMMARY OF THE INVENTION

Accordingly, the present invention is directed to a signal generating apparatus, and further to a power on reset signal generating apparatus.

The present invention is directed to a power on reset signal apparatus, and is used to adjust the effective width of the power on reset signal, and offers a circuit design with a small capacitor.

The present invention is directed to a method for generating a power on reset signal, and is used to adjust the period of the power on reset signal, and is applied to a circuit design with a small capacitor.

The present invention is directed to a power on reset signal generating apparatus. The power on reset signal generating apparatus includes a trigger capacitor, a reference current supplying circuit, and a current regulator. One end of the trigger capacitor is coupled to a ground voltage. The other end of the trigger capacitor is coupled to a signal generating end, and generates a power on reset signal. The reference current supplying circuit is coupled to the signal generating end, and the reference current applying circuit supplies a reference current to the signal generating end. A current regulator is coupled to the signal generating end, and the signal generating end draws a splitting current to adjust the value of the current received by the trigger capacitor.

According to an embodiment of the present invention, the reference current supplying circuit includes a current source, a first current mirror, and a second current minor. The input of the first current mirror is coupled to the current source, and mirrors the current supplied by the current source to generate a first current at the end of the output of the current mirror. The second current mirror is coupled to the first current mirror, and the second current mirror receives and mirrors the first current to generate the reference current.

According to an embodiment of the present invention, the current source includes at least a transistor. The drain end of the transistor and the source end of the transistor are serially connected between a power voltage and the first current mirror, and the gate end of the transistor is coupled to the ground voltage.

According to an embodiment of the present invention, the first current mirror includes a first transistor and a second transistor. The drain end of the first transistor is coupled to the current source, and the gate end of the first transistor is coupled to the drain end of the first transistor, and the source end of the first transistor is coupled to a ground voltage. The drain end of the second transistor is coupled to the second current mirror, and the gate end of the second transistor is coupled to the gate end of the first transistor, and the source end of the second transistor is coupled to the ground voltage.

The second current mirror includes a third transistor, a fourth transistor, and a fifth transistor. The drain end of the third transistor is coupled to the drain end of the second transistor, and the gate end of the third transistor is coupled to the drain end of the third transistor, and the source end of the third transistor is coupled to a power voltage. The drain end of the fourth transistor is coupled to the current regulator, and the gate end of the fourth transistor is coupled to the gate end of the third transistor, and the source end of the fourth transistor is coupled to the power voltage. The drain end of the fifth transistor is coupled to the trigger capacitor, and the gate end of the fifth transistor is coupled to the gate end of the third transistor, and the source end of the fifth transistor is coupled to the power voltage.

According to an embodiment of the present invention, the current regulator includes a third current mirror, and the third current mirror includes a sixth transistor and a seventh transistor. The drain end of the sixth transistor is coupled to the drain end of the fourth transistor, and the gate end of the sixth transistor is coupled to the drain end of the sixth transistor, and the source end of the sixth transistor is coupled to the ground voltage. The drain end of the seventh transistor is coupled to the trigger capacitor, and the gate end of the seventh transistor is coupled to the gate end of the sixth transistor, and the source end of the seventh transistor coupled to the ground voltage.

According to an embodiment of the present invention, the first transistor and the second transistor are N-type transistors.

According to an embodiment of the present invention, the third transistor, the fourth transistor and the fifth transistor are P-type transistors.

According to an embodiment of the present invention, the sixth transistor and the seventh transistor are N-type transistors.

According to an embodiment of the present invention, the power on reset signal generating apparatus further includes a voltage trigger. The voltage trigger is coupled to the signal generating end, and generates an adjusted power on reset signal according to the power on reset signal.

According to an embodiment of the present invention, the power on reset signal generating apparatus further includes a buffer. The buffer is coupled to the voltage trigger. The buffer receives the adjusted power on reset signal, and generates a buffer power on reset signal.

The present invention is directed to a method for generating a power on reset signal. The method for generating a power on reset signal includes the following steps: applying a reference current to a signal generating end wherein the signal generating end is coupled to one end of a trigger capacitor, and the signal generating end draws a splitting current to adjust the current received by the trigger capacitor wherein the trigger capacitor generates the power on reset signal at the signal generating end according to the value of the current received by the trigger capacitor.

According to an embodiment of the present invention, the splitting current is generated according to the reference current.

As described above, the present invention provides a power on reset signal generating apparatus. The power on reset signal generating apparatus utilizes a current regulator to adjust the current received by a trigger capacitor which generates a power on reset signal, and to adjust the period of the power on reset signal. Then, the power on reset signal generating apparatus may be implemented with a small capacitor.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
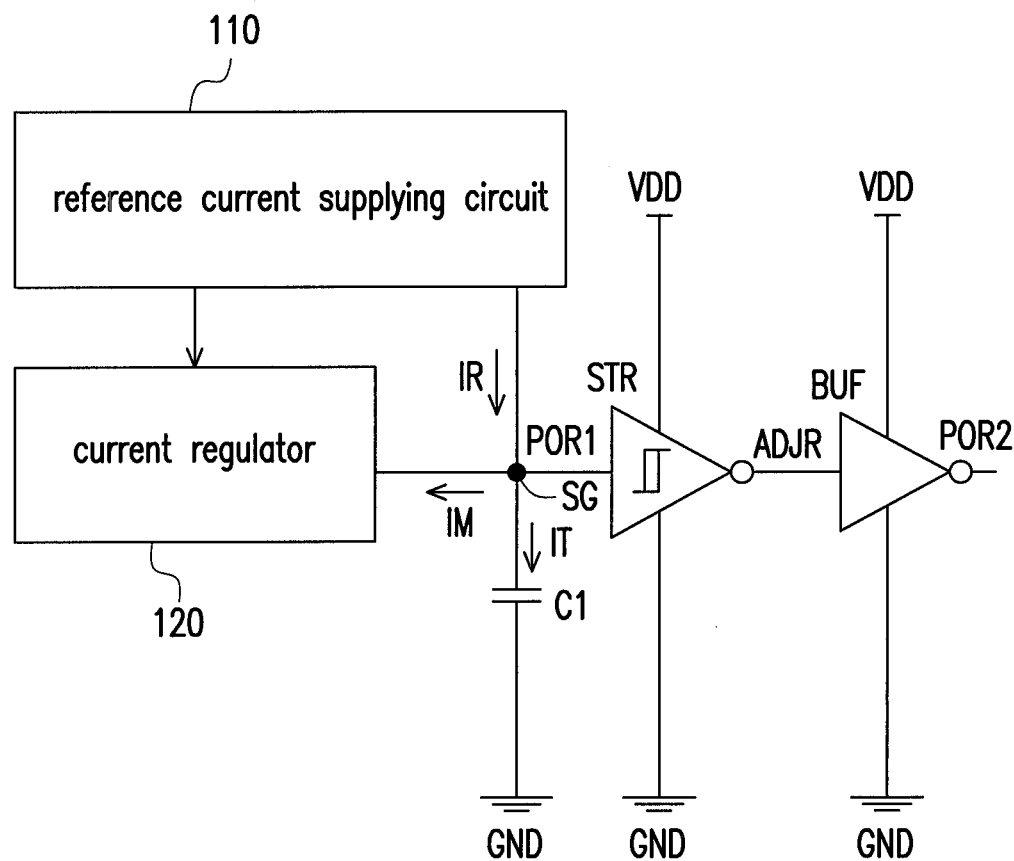
FIG. 1 shows a schematic view of the power on reset signal generating apparatus according to an embodiment of the invention.

Reference will now be made in detail to the present embodiments of the invention, examples of which are illustrated in the accompanying drawings. Wherever possible, the same reference numbers are used in the drawings and the description to refer to the same or like parts.

FIG. 1 shows a schematic view of the power on reset signal generating apparatus 100 according to an embodiment of the invention. Please refer to FIG. 1. The power on reset signal generating apparatus 100 includes a trigger capacitor C1, a reference current supplying circuit 110, a current regulator 120, a voltage trigger STR, and a buffer BUF. The reference current supplying circuit 110 generates a reference current IR to the signal generating end SG through the received power voltage VDD when the power on reset signal generating apparatus 100 is activated. The two ends of the trigger capacitor C1 are respectively coupled to a ground voltage GND and the signal generating end SG, and a power on reset signal POR1 is generated through the current IT flowing from the signal generating end SG to the capacitor C1.

The current regulator 120 is coupled to the signal generating end SG. While the current IR flows to the signal generating end SG, the current regulator 120 drains a splitting current IM from the signal generating end SG. The value of the current IT received by the trigger capacitor C1 is adjusted according to the value of the drained splitting current IM. In the other words, the power on reset signal POR1 is generated by controlling the uptrend slope of the voltage at the signal generating end SG which is controlled by the splitting current IM.

In this embodiment, the voltage trigger STR is coupled to the signal generating end SG, and an adjusted power on reset signal ADJR is generated according to the received power on reset signal POR1. As described above, the voltage trigger STR can be a Schmitt trigger, and the Schmitt trigger is used to generate the adjusted power on reset signal ADJR with stable pulses width. The buffer BUF is coupled to the voltage trigger STR to receive the adjusted power on reset signal ADJR, and generates a buffer power on reset signal POR2 according to the received adjusted power on reset signal ADJR.

In other words, the power on reset signal generating apparatus 100 generates the reference current IR at the signal generating end SG by the reference current supplying circuit 110, and adjusts the current flowing to the trigger capacitor C1 through the current regulator 120 to generate the power on reset signal POR1. Then, the buffer BUF finally outputs the buffer power on reset signal POR2 through the voltage trigger STR. According to the current adjustment described above, the current received by the trigger capacitor C1 is practically reduced. Such as that, the power on reset signal POR1 with an effective width can be generated with a small size trigger capacitor C1.

Figure 2:
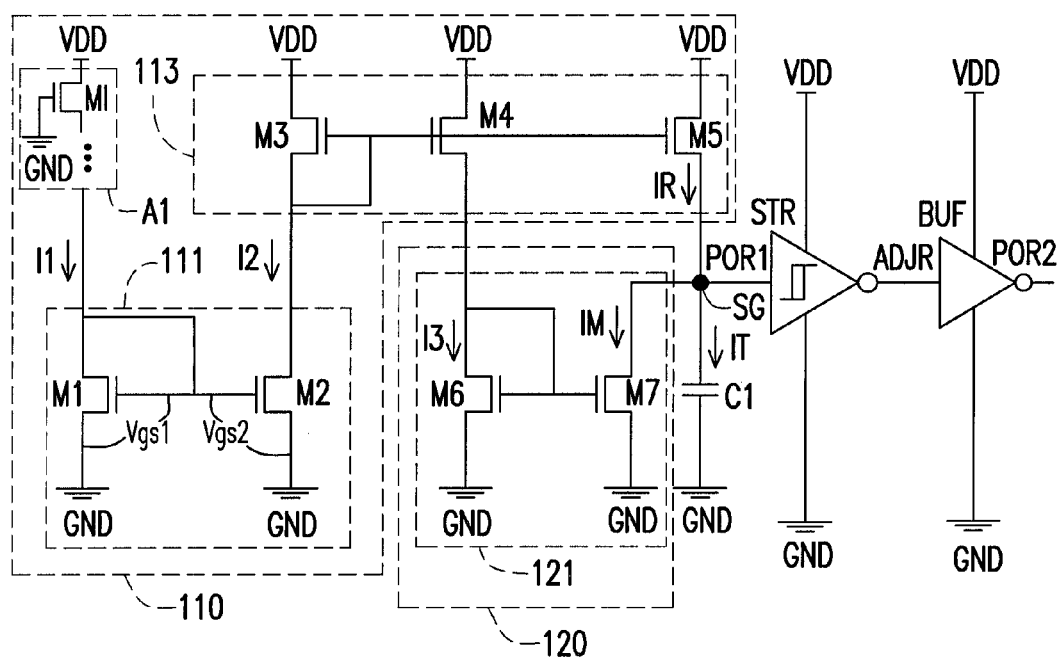
FIG. 2 shows the circuit of the power on reset signal generating apparatus according to an embodiment of the invention.

FIG. 2 shows the circuit of the power on reset signal generating apparatus 100 according to an embodiment of the invention. Specifically, the reference current supplying circuit 110 includes a current source A1, a current mirror 111, and a current mirror 113. The current source A1 is coupled to the current mirror 111, and the current source A1 supplies a current I1 to current mirror 111. The current mirror 111 receives and mirrors the received current I1 to generate a current I2 at the output terminal thereof. The current mirror 111 is coupled to the current mirror 113, and applies the current I2 to the current mirror 113. The current mirror 113 mirrors the received current I2 to generate a current I3 and the reference current IR respectively. In addition, the current source A1 can be implemented with at least one transistor MI. As described above, the drain end and the source end of the transistor MI are serially connected between the source voltage VDD and the current mirror 111 respectively, and the gate of the transistor MI is coupled to the ground voltage GND.

The current 111 includes a transistor M1 and a transistor M2. In this embodiment, the transistor M1 and the transistor M2 are N-type transistors. The drain end of the transistor M1 is coupled to the current source A1, and the gate end of the transistor M1 is coupled to the drain end of the transistor M1, and the source end of the transistor M1 is coupled to the ground voltage GND. Additionally, the gate end of transistor M2 is coupled to the gate end of the transistor M1, and the source end of the transistor M2 is coupled to the ground voltage GND, and the drain end of the transistor M2 outputs the current I2.

As described above, when the power voltage VDD is applied to the power on reset signal generating apparatus 100, the current source A1 also generates the current I1 which flows to the drain end of the transistor M1. Because the gate end of the transistor M1 is coupled to the drain end of the transistor M1, the transistor M1 operates in the saturation region while receiving the current I1. According to the current characteristic of a common transistor in the saturation region, the voltage difference between the gate end and the source end of a transistor is positively correlated with the current thereof. Therefore, when the transistor M1 receives the current I1 from the current source A1, the voltage difference between the gate end and the source end of the transistor M1 (Vgs1) is determined. For the transistor M2, the voltage difference between the gate end and the source end of the transistor M2 (Vgs2) decides the value of the current I2 flowing through the transistor M2. The source end of the transistor M2 and the source end of the transistor M1 are coupled to the ground voltage GND, and the gate end of the transistor M2 is coupled to the gate end of the transistor M1 to cause the same bias voltage level between the gate end of the transistor M1 and the gate end of the transistor M2. Therefore, the voltage difference between the gate end of the transistor M2 and the source end of the transistor M2 (Vgs2) equals to the voltage difference between the gate end of the transistor M1 and the source end of the transistor M1 (Vgs1). In this circumstance, the value of current I2 is determined by the value of the current I1 and the characteristics of the transistor M1-M2. For example, the value of the current I2 is determined by the value of the current I2, the widths, the lengths, and the semiconductor process parameters of the transistor M1 and the transistor M2.

The current mirror 113 includes a transistor M3, a transistor M4, and a transistor M5. In the embodiment, the transistor M3, the transistor M4, and the transistor M5 are P-type transistors. The drain end of the transistor M3 receives the current I2 from the current mirror 111, and the gate end of the transistor M3 is coupled to the drain end of the transistor M3, and the source end of the transistor M3 is coupled to the power voltage VDD. The source end of the transistor M4 is coupled to the power voltage VDD, and the drain end of the transistor M4 outputs the current I3 to the current regulator 120. Besides, the gate end of the transistor M5 is coupled to the gate end of the transistor M3, and the source end of the transistor M5 is coupled to the power voltage VDD, and the drain end of the transistor M5 outputs the reference current IR to the signal generating end SG. As the same axiom of the current mirror 111, the current mirror 113 applies the current I3 to the current regulator 120 according to the current I2, and according to the characteristics of the transistor M3 and the transistor M4. Likewise, the current mirror 113 applies the reference current IR to the signal generating end SG according to the current I2, and according to the characteristics of the transistor M3 and the transistor M5.

As described above, the current regulator 120 includes a current mirror 121, and the current mirror 121 includes a transistor M6 and a transistor M7. In the embodiment, the transistor M6 and the transistor M7 are N-type transistors. The drain end of the transistor M6 receives the current I3 from the output of the current mirror 113, and the gate end of the current mirror M6 is coupled to the drain end of the transistor M6, and the source end of the transistor M6 is coupled to the ground voltage GND. The gate end of the transistor M7 is coupled to the gate end of the transistor M6, and the source end of the transistor M7 is coupled to the ground voltage GND, and the drain end of the transistor M7 is coupled to the signal generating end SG. The current mirror 121 mirrors the current I3 from the current mirror 113 to generate the splitting current IM.

It is noteworthy that the current IT may be less than the leakage current of a transistor when the current IT flowing through the trigger capacitor C1 is reduced to the value of a few nano-ampere. In this condition, the current IT charges the trigger capacitance C1 ineffectively, and a power on reset signal POR1 may not be generated effectively at the signal generating end SG. The embodiment includes the transistor M7, and when the trigger capacitor C1 is not charged effectively, the transistor M7 is working in the linear region. In the meantime, the splitting current IM flowing through the transistor M7 is positively correlated with the voltage on the trigger capacitor C1. When the trigger capacitor C1 is not charged effectively, the transistor M7 reduces the drawn splitting current IM according to the low voltage of the trigger capacitor C1, and causes the current IT flowing through the trigger capacitor C1 to charge the trigger capacitor C1 effectively, and the leakage current of transistors has less influence on the current IT. Then, the problem about the leakage current is solved.

Figure 3:
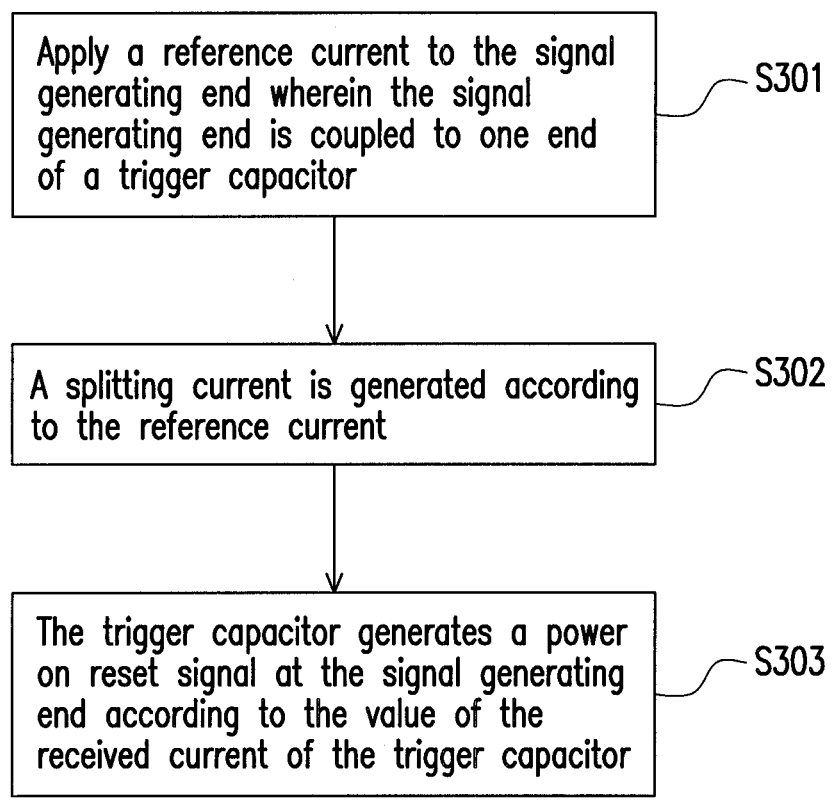
FIG. 3 shows a flow chart of a method for generating a power on reset signal according to an embodiment of the invention.

FIG. 3 shows a flow chart of a method for generating a power on reset signal according to an embodiment of the invention. Please refer to FIG. 3. Firstly, apply a reference current to the signal generating end wherein the signal generating end is coupled to one end of a trigger capacitor (step S201). Meanwhile, the current flowing form the signal generating end to the trigger capacitor charges the trigger capacitor. Then, a splitting current is generated according to the reference current (step S202). In this step, the current flowing to the trigger capacitor is adjusted by generating the splitting current. Finally, the trigger capacitor generates a power on reset signal at the signal generating end according to the value of the received current of the trigger capacitor (step S203). In other words, the period to charge the trigger capacitor is adjusted through adjusting the current received by the trigger capacitor so as to generate the power on reset signal at the signal generating end.

The embodiment of the method for generating a power on reset signal has already been described above in detail, and will be not repeated hereafter.

In summary, the present invention offers a power on reset signal generating apparatus and the method for generating a power on reset signal. A current regulator is used to adjust the current flowing through a trigger capacitor which generates a power on reset signal and adjusts the effective width of the power on reset signal. In addition, the power on reset signal generating apparatus can reduce the layout area of the capacitor of the circuit thereof.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A power on reset signal generating apparatus, comprising:
    a trigger capacitor, one end of the trigger capacitor coupled to a ground voltage, the other end of the trigger capacitor coupled to a signal generating end, a power on reset signal is generated at the signal generating end;
    a reference current supplying circuit, coupled to the signal generating end, and the reference current applying circuit supplying a reference current to the signal generating end, wherein the reference current supplying circuit comprises:
        a current source, comprises at least a transistor;
        a first current mirror, an input terminal of the first current mirror coupled to the current source, and the first current mirror mirroring the current supplied by the current source to generate a first current at the end of an output terminal of the current mirror; and
        a second current mirror, coupled to the first current mirror, and the second current mirror receiving and mirroring the first current to generate the reference current,
    wherein, the drain end of the transistor and the source end of the transistor are connected to a power voltage and the first current mirror respectively, and the gate end of the transistor is coupled to the ground voltage; and
    a current regulator, coupled to the signal generating end, and a splitting current flowing from the signal generating end into the current regulator for adjusting the value of the current received by the trigger capacitor.

2. The power on reset signal generating apparatus as claimed in claim 1, wherein the first current mirror comprises:
    a first transistor, the drain end of the first transistor coupled to the current source, the gate end of the first transistor coupled to the drain end of the first transistor, and the source end of the first transistor coupled to the ground voltage; and
    a second transistor, the drain end of the second transistor coupled to the second current mirror, the gate end of the second transistor coupled to the gate end of the first transistor, and the source end of the second transistor coupled to the ground voltage.

3. The power on reset signal generating apparatus as claimed in claim 2, wherein the second current mirror comprises:
a third transistor, the drain end of the third transistor coupled to the drain end of the second transistor, the gate end of the third transistor coupled to the drain end of the third transistor, and the source end of the third transistor coupled to a power voltage;
a fourth transistor, the drain end of the fourth transistor coupled to the current regulator, the gate end of the fourth transistor coupled to the gate end of the third transistor, and the source end of the fourth transistor coupled to the power voltage; and
a fifth transistor, the drain end of the fifth transistor coupled to the trigger capacitor, the gate end of the fifth transistor coupled to the gate end of the third transistor, and the source end of the fifth transistor coupled to the power voltage.

4. The power on reset signal generating apparatus as claimed in claim 3, wherein the current regulator comprises a third current minor and the third current mirror comprises:
a sixth transistor, the drain end of the sixth transistor coupled to the drain end of the fourth transistor, the gate end of the sixth transistor coupled to the drain end of the sixth transistor, and the source end of the sixth transistor coupled to the ground voltage; and
a seventh transistor, the drain end of the seventh transistor coupled to the trigger capacitor, the gate end of the seventh transistor coupled to the gate end of the sixth transistor, and the source end of the seventh transistor coupled to the ground voltage.

5. The power on reset signal generating apparatus as claimed in claim 2, wherein the first transistor and the second transistor are N-type transistors.

6. The power on reset signal generating apparatus as claimed in claim 3, wherein the third transistor, the fourth transistor and the fifth transistor are P-type transistors.

7. The power on reset signal generating apparatus as claimed in claim 4, wherein the sixth transistor and the seventh transistor are N-type transistors.

8. The power on reset signal generating apparatus as claimed in claim 1, further comprising:
a voltage trigger, coupled to the signal generating end, and generating an adjusted power on reset signal according to the power on reset signal.

9. The power on reset signal generating apparatus as claimed in claim 8, further comprising:
a buffer, coupled to the voltage trigger, receiving the adjusted power on reset signal ,and generating a buffer power on reset signal.

* * * * *